(12) United States Patent
Rokugawa et al.

(10) Patent No.: US 7,019,404 B2
(45) Date of Patent: Mar. 28, 2006

(54) MULTILAYERED CIRCUIT SUBSTRATE, SEMICONDUCTOR DEVICE AND METHOD OF PRODUCING SAME

(75) Inventors: Akio Rokugawa, Nagano (JP); Takahiro Iijima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 173 days.

(21) Appl. No.: 10/347,602

(22) Filed: Jan. 22, 2003

(65) Prior Publication Data

US 2003/0138992 A1  Jul. 24, 2003

(30) Foreign Application Priority Data

Jan. 24, 2002 (JP) .............................. 2002-015504

(51) Int. Cl.
*H01L 29/40* (2006.01)

(52) U.S. Cl. ...................................... 257/778; 257/698
(58) Field of Classification Search ................ 257/778, 257/701, 703, 723, 724, 698
See application file for complete search history.

(56) References Cited

U.S. PATENT DOCUMENTS

| | | | | |
|---|---|---|---|---|
| 4,075,757 A | * | 2/1978 | Malm et al. ................... 216/18 |
| 5,281,151 A | * | 1/1994 | Arima et al. .................. 439/68 |
| 5,654,590 A | * | 8/1997 | Kuramochi .................. 257/778 |
| 5,918,113 A | * | 6/1999 | Higashi et al. ............. 438/119 |
| 5,939,782 A | * | 8/1999 | Malladi ....................... 257/698 |
| 6,090,633 A | * | 7/2000 | Yu et al. ........................ 438/15 |
| 6,208,525 B1 | * | 3/2001 | Imasu et al. ................. 361/783 |
| 6,384,485 B1 | * | 5/2002 | Matsushima ................ 257/778 |
| 6,418,615 B1 | | 7/2002 | Rokugawa et al. |

FOREIGN PATENT DOCUMENTS

JP    11-68025     3/1999
JP    2000-323613  11/2000

* cited by examiner

*Primary Examiner*—Michael Lebentritt
*Assistant Examiner*—Andre' Stevenson
(74) *Attorney, Agent, or Firm*—Staas & Halsey LLP

(57) ABSTRACT

A multi-layered circuit substrate for a semiconductor device comprises a multi-layered circuit substrate body having first and second surfaces and comprising a plurality of conductive pattern layers integrally laminated one on the other from the first surface to the second surface, so that a plurality of semiconductor device elements can be arranged on the first surface of the substrate body; and a plate member, a rigidity thereof being higher than that of the substrate body, attached to the second surface of the substrate body. A plurality of semiconductor elements can be mounted on the semiconductor element mounting surface defined on the first surface of the substrate body.

10 Claims, 10 Drawing Sheets

MULTILAYERED CIRCUIT SUBSTRATE, SEMICONDUCTOR DEVICE AND METHOD OF PRODUCING SAME

BACKGROUND OF THE INVENTION

1. Field of the Invention

The present invention relates to a multi-layered circuit substrate for a semiconductor device. Further, the present invention relates to a method of manufacturing the multilayered circuit substrate. Furthermore, the present invention relates to a semiconductor device using such a substrate and a method of producing the same. More particularly, the present invention relates to a multilayered circuit substrate for a semiconductor device having a semiconductor element mounting face on which a plurality of semiconductor elements can be mounted being arranged in the plane direction on one side of the multilayered circuit substrate composed by laminating a plurality of conductor patterns. Further, the present invention relates to a method of producing the multilayered circuit substrate, a semiconductor device, and a method of producing the same.

2. Description of the Related Art

Recently, there has been provided a semiconductor device referred to as a system-in-package (SIP) in which a plurality of semiconductor elements are mounted on one circuit substrate. This semiconductor device will be referred to as "SIP", hereinafter.

A size of the aforementioned SIP is appropriate to be handled as a chip. An example of SIP is shown in FIGS. 7(a) and 7(b). SIP 100 shown in FIG. 7(a) is composed in such a manner that semiconductor elements 104a, 104b, 104c, the functions of which are different from each other, are mounted in the plane direction on a semiconductor element mounting face formed on one face of a piece of multilayered circuit substrate 102.

As shown in FIG. 7(b), the multilayered circuit substrate 102 forming the above SIP 100 is composed of resin layers 102a, 102b, 102c, 102d which are made of insulating resin, and the conductor patterns 106, 106, . . . and the via holes 108, 108, . . . are formed being laminated on these resin layers 102a, 102b, 102c, 102d.

On one face of the multilayered circuit substrate 102, there are provided connection pads 110, 110, . . . , from which the connecting faces to be connected with the electrode terminals of the semiconductor elements 104a, 104b, 104c are exposed. On the other face of the multilayered circuit substrate 102, there are provided external connection pads 114, 114, . . . , from which the attaching faces on which the solder balls 112, 112, . . . are attached are exposed.

The connection pads 110, 110, . . . and the external connection pads 114, 114, . . . are electrically connected with each other by the conductor patterns 106, 106, . . . and the via holes 108, 108, . . . which are formed and laminated on the resin layers 102a, 102b, 102c, 102d.

One face and the other face of the above multilayered circuit substrate are covered with the protective films 116, 118 made of solder resist except for the connection pads 110, 110, . . . and the external connection pads 114, 114, . . . .

In this connection, the potting resin 120 is filled between the semiconductor element mounting face, which is formed on one face of the multilayered circuit substrate 102, and the semiconductor elements 104a, 104b, 104c mounted on the semiconductor element mounting face.

When SIP 100 shown in FIGS. 7(a) and 7(b) is used, the size of SIP can be reduced to be smaller than the size of a device in which a plurality of semiconductor devices, each semiconductor device having a single semiconductor element, are used. Further, it is possible to reduce a conductor distance between the semiconductor elements 104a, 104b, 104c. Therefore, a signal can be sent and received between the semiconductor elements at high transmission speed.

However, SIP 100 shown in FIGS. 7(a) and 7(b) is composed of a multilayered circuit substrate 102 actually made of resin. Therefore, rigidity of the multilayered circuit substrate 102 is not sufficiently high.

Therefore, the present inventors made investigations into SIP 200 shown in FIGS. 8(a) and 8(b). As shown in FIG. 8(b), the multilayered circuit substrate 202 composing this SIP 200 is formed by laminating the resin layers 202a, 202b made of insulating resin on which conductor patterns 106, 106 . . . and the via holes 108, 108 . . . are formed. On one face of the multilayered circuit substrate 200, there are provided connection pads 110, 110, . . . , from which the connecting faces to be connected with the electrode terminals of the semiconductor elements 104a, 104b, 104c are exposed.

On the other face of the multilayered circuit substrate 202, the metallic plate 204, which is a plate-shaped member having a rigidity higher than that of the multilayered circuit substrate 202, is bonded by the adhesive layer 206 made of insulating resin.

Since metallic plate 204 is joined to the other face of the multilayered circuit substrate 202, SIP 200 and other electronic parts are electrically connected with each other by a lead frame as shown in FIGS. 8(a) and 8(b). Specifically, an end portion of each inner lead 300, 300, . . . of the lead frame is connected with an exposure face of each external connection pad 208, 208, . . . formed along the outer edge of the multilayered circuit substrate 202 by the wire 302.

In this SIP 200, the highly rigid metallic plate 204 is joined to the other face of the multilayered substrate 202. Therefore, rigidity of this SIP 200 is actually enhanced and higher than that of the multilayered circuit substrate 102 made of resin shown in FIGS. 7(a) and 7(b).

However, since the coefficient of thermal expansion of the multilayered circuit substrate 202 actually made of resin and that of the metallic plate 204 are different from each other, stress is generated between them. Cracks tend to be caused on SIP 200 by the thus generated stress.

Since the multilayered circuit substrate 202 shown in FIGS. 8(a) and 8(b) is successively laminated from the resin layer 202a provided on the metallic plate 204 side. Therefore, on a surface of the resin layer 202b laminated on the resin layer 202a, especially on a surface of the resin layer 202b corresponding to the via hole 108 formed on the resin layer 202a, a concave surface, or indentation, tends to be formed as shown in FIG. 9. Therefore, the surface of the resin layer 202b tends to become irregular.

When the connection pad 110 to be connected with the electrode terminal of the semiconductor element is formed on the irregular face of the resin layer 202b as shown in FIG. 9, an exposed face of the connection pad 110 is formed into an irregular face, following the irregular face of the resin layer 202b.

In the case where the exposed face of the connection pad 110 is formed into an irregular face, when a semiconductor element is mounted on a semiconductor element mounting face of the multilayer circuit substrate 202, an electrode terminal of the semiconductor element does not come into contact with the exposed face of the connection pad 110, which causes an imperfect contact and reliability of the finally obtained SIP 200 is deteriorated.

Although the irregular face formed on the resin layer 202b of the multilayer circuit substrate 202 can be flattened by means of polishing, it is necessary to add a polishing process to the conventional manufacturing process of SIP 200, which raises the manufacturing cost of SIP 200. For the above reasons, it is preferable that the semiconductor element mounting face of the multilayered circuit substrate 202 is flattened without adding the polishing process.

SUMMARY OF THE INVENTION

Therefore, a first object of the present invention is to provide a multilayered circuit substrate for a semiconductor device and a method of manufacturing it capable of being handled as a chip in which a semiconductor element mounting face, on which a plurality of semiconductor elements are mounted in the plane direction, can be formed into a flat face on one face of a rigid multilayered circuit substrate without polishing the semiconductor element mounting face.

A second object of the present invention is to provide a highly reliable semiconductor device formed in such a manner that a plurality of semiconductor elements are mounted in the plane direction on a semiconductor element mounting face formed on one face of a multilayered circuit substrate, the size of which is suitable to be handled as a chip.

In order to accomplish the above tasks, the present inventors made investigations. As a result, they found that a flat semiconductor element mounting face can be formed on one face of a highly rigid multilayered circuit substrate as follows. On a multilayered circuit substrate, the size of which is appropriate to be handled as a chip, formed by successively laminating resin layers on one face of a metallic plate from the semiconductor element mounting face side, a metallic plate, the rigidity of which is higher than that of this multilayered circuit substrate, is joined, and then the metallic plate is removed by means of etching.

According to the present invention, there is provided a multi-layered circuit substrate for a semiconductor device comprising: a multi-layered circuit substrate body having first and second surfaces and comprising a plurality of conductive pattern layers integrally laminated one on the other from the first surface to the second surface, so that a plurality of semiconductor device elements can be arranged on the first surface of the substrate body; and a plate member, a rigidity thereof being higher than that of the substrate body, attached to the second surface of the substrate body.

The multi-layered circuit substrate further comprises: an elastic resin layer so that the plate member is attached to the second surface of the substrate body by means of the elastic resin layer. The elastic resin layer may be a silicone resin.

The multi-layered circuit substrate comprises: external connecting pads formed on the first surface of the substrate body.

The plate member is a highly rigid circuit substrate body having a conductive pattern, which is electrically connected to the conductive pattern of the multi-layered circuit substrate body.

The conductive pattern of the high rigid substrate is electrically connected to the conductive pattern of the multi-layered circuit substrate body by means of solder bonding.

The highly rigid circuit substrate body is attached to the multi-layered circuit substrate body by means of an anisotropic conductive adhesive layer which comprises an elastic resin and conductive particles contained in the elastic resin.

The plate member may be used as a ground layer or power supply layer. Also, a semiconductor circuit, such as a capacitor or resistance, can be formed on the plate member.

According to another aspect of the present invention, there is provided a method of producing a multi-layered circuit substrate for a semiconductor device, the process comprising the following steps of: forming connecting pads on a metal plate; successively laminating a plurality of resin layers, on which conductive patterns are formed, on the metal plate layer, so that the conductive patterns are electrically connected to the connecting pads, to form a multi-layered circuit substrate body having first and second surfaces thereof, the first surface thereof attached to the metal plate; attaching a plate member, a rigidity thereof being higher than that of the multi-layered circuit substrate body, to the second surface thereof; and removing the metal plate so that a semiconductor device mounting surface is exposed.

According to still another aspect of the present invention, there is provided a multi-layered circuit substrate body having first and second surfaces thereof and comprising a plurality of conductive pattern layers integrally laminated together from the first surface to the second surface, so that a semiconductor element mounting surface is defined on the first surface of the substrate body; a plate member, a rigidity thereof being higher than that of the substrate body, attached to the second surface of the substrate body; and a plurality of semiconductor elements mounted on the semiconductor element mounting surface defined on the first surface of the substrate body.

According to a further aspect of the present invention, there is provided a method of producing a semiconductor device comprising the following steps of: forming connecting pads on a metal plate; successively laminating a plurality of resin layers, on which conductive patterns are formed, on the metal plate, so that the conductive patterns are electrically connected to the connecting pads, to form a multi-layered circuit substrate body having first and second surfaces thereof, the first surface thereof attached to the metal plate; attaching a plate member, a rigidity thereof being higher than that of the multi-layered circuit substrate body, to the second surface thereof; removing the metal plate so that a semiconductor device mounting surface is exposed; and mounting a plurality of semiconductor elements on the semiconductor element mounting surface, so that electrode terminals of semiconductor elements are electrically connected with the connecting pads.

According to the present invention, one face of a multilayered circuit substrate, the size of which is appropriate to be handled as a chip, which is obtained when resin layers are successively formed from one face side to the other face side, is made to be a semiconductor element mounting face. A resin layer formed on the multilayered circuit substrate for the first time is usually formed on a flat face of a plate. Therefore, the resin layer is not affected by via holes formed on the lower resin layers. Accordingly, a surface of the layer formed for the first time can be made as flat as possible. Therefore, the surface of the first formed layer is used as a semiconductor element mounting face from which a connection face of a connection pad to be connected with an electrode terminal of a semiconductor element is exposed. Therefore, it is possible to form a flat semiconductor element mounting face.

On the other hand, the other face of the multilayered circuit substrate formed on the opening side of via holes is affected by the via holes formed on the lower resin layer. Therefore, the surface of the other face tends to become irregular.

In order to solve the above problems, according to the present invention, the other face of the multilayered circuit substrate is joined to one face of a plate-shaped member, the rigidity of which is higher than that of the multilayered circuit substrate, via the elastic resin layer. Therefore, irregularities formed on the other face of the multilayered circuit substrate can be absorbed by the elastic resin layer, and the rigidity of the multilayered circuit substrate can be enhanced.

DETAILED DESCRIPTION OF THE PREFERRED EMBODIMENTS

Figure 1:
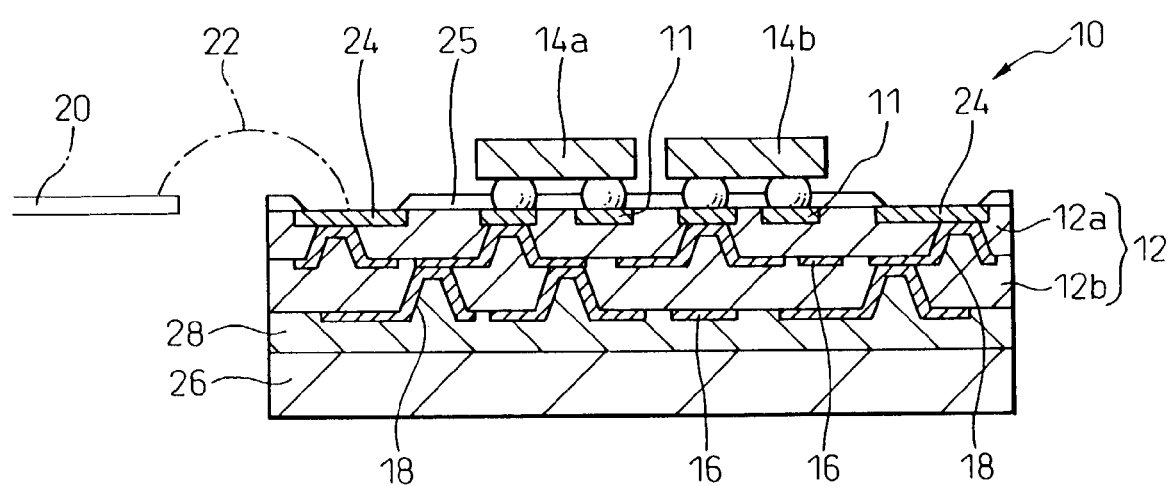
FIG. 1 is a sectional view for explaining an example of a semiconductor device of the present invention.

An example of the semiconductor device of the present invention is shown in FIG. 1. The semiconductor device 10 shown in FIG. 1 is a semiconductor device, which is referred to as a system-in-package, in which the semiconductor elements 14a, 14b respectively having different functions are mounted on one face of a piece of multilayered circuit substrate 12. This semiconductor device will be referred to as SIP 10, hereinafter in this specification. A size of this SIP 10 is appropriate to be handled as a chip.

As described later, on the multilayered circuit substrate 12 forming SIP 10, there are provided resin layers 12a, 12b which are successively laminated on each other. On the resin layer 12a forming one face of the multilayered circuit substrate 12, there is provided a semiconductor element mounting face from which a connection face of each connection pad 11, 11, . . . to be connected with each electrode terminal of the semiconductor element 14a, 14b are exposed.

The other face of the thus composed multilayered circuit substrate 12 is joined to the plate member 26, the rigidity of which is higher than that of the multilayered circuit substrate 12, via the elastic resin layer 28.

Concerning this plate-shaped member 26, it is preferable to use a plate-shaped member made of silicon (Si) or alloy of iron (Fe)-nickel (Ni) or alloy of iron (Fe)-nickel (Ni)-Cobalt (Co), the coefficient of thermal expansion of which is approximate to that of silicon composing the semiconductor elements 14a, 14b to be mounted. The reason is described as follows. When members, the coefficients of thermal expansion of which are approximate to each other, are attached to both sides of the multilayered circuit substrate 12, it is possible to effectively prevent the multilayered circuit substrate 12 from warping.

Concerning the resin composing the elastic resin layer 28, it is preferable to use an insulating resin having a rubber elasticity, for example, it is preferable to use silicone rubber or elastomer.

When the plate-shaped member 26 is joined to the other face of the multilayered circuit substrate 12 via the elastic resin layer 28 as described above, rigidity of the multilayered circuit substrate 12 can be enhanced, and it can be handled easily.

Further, on the multilayered circuit substrate 12 on which the resin layers 12a, 12b are successively laminated, the via holes 18, 18, . . . , which are electrically connected with the conductor patterns 16, 16, . . . formed on one side of each resin layer 12a, 12b, are formed in such a manner that the via holes 18, 18, . . . are open to the other face of the multilayered circuit substrate 12. Therefore, the other face of multilayered circuit substrate 12 is affected by the via holes 18, 18, . . . and tends to be formed irregular, however, the irregularities formed on the other face of the multilayered circuit substrate 12 are absorbed by the elastic layer 28 and joined to the plate member 26.

Even if thermal stress is caused by a difference in the coefficient of thermal expansion between the multilayered circuit substrate 12, the primary component of which is resin, and the plate-shaped member 26, it is absorbed by the elastic resin layer 28. Therefore, the occurrence of cracks on the multilayered circuit substrate 12 and the plate-shaped member 26 can be prevented.

In the case of SIP 10 shown in FIG. 1, the plate-shaped member 26, on which external connection pads are not formed, is joined to the other face of the multilayered circuit substrate 12. Therefore, in the peripheral section of the semiconductor element mounting face of the multilayered circuit substrate 12, there are provided external connection pads 24 which are electrically connected via the wires 22 with the inner leads 20, 20 . . . of the lead frame connected with the other electronic parts.

The connection pads 11, 11, . . . and the external connection pads 24, 24, . . . are electrically connected with each other by the conductor patterns 16, 16, . . . , which are formed on one face of the resin layers 12a, 12b, and the via holes 18, 18, . . . .

Further, one face of the multilayered circuit substrate 12 is covered with the protective film 25 made of solder resist except for the connection pads 11, 11, . . . and the external connection pads 24, 24, . . . .

In this connection, potting resin is charged between the semiconductor element mounting face, which is formed on one face of the multilayered circuit substrate 12, and the semiconductor elements 14a, 14b mounted on the mounting face.

As shown in FIGS. 2 and 3, the multilayered circuit substrate 12 composing SIP 10 shown in FIG. 1 is composed in such a manner that after the resin layer 12a has been formed on one face of the metallic plate, the resin layer 12b is laminated on it.

Figure 2A:
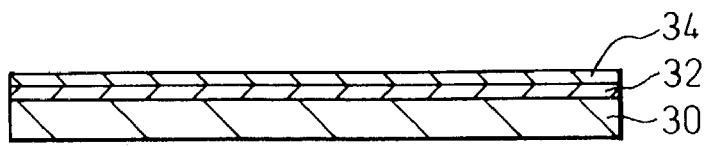
FIGS. 2(a) to 2(c) and FIGS. 3(a) to 3(c) are process drawings of manufacturing a multilayered circuit substrate for the semiconductor device shown in FIG. 1.

In other words, after the thin resin layer 32 has been formed on one face of the metallic plate 30 made of copper, the thin metallic layer 34 made of copper is formed by means of spattering or electroless plating as shown in FIG. 2(a).

Figure 2B:
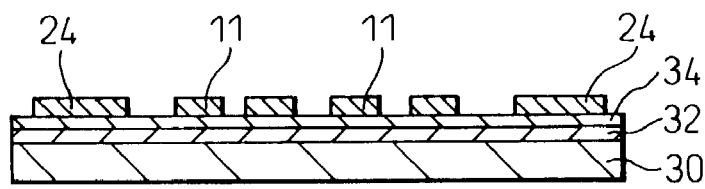

Further, the connection pads 11, 11, . . . and the external connection pads 24, 24, . . . are formed on the thin metallic layer 34 by the semiadditive method. According to the semiadditive method, a resist layer, which is formed by coating photosensitive resist on the thin metallic layer 34, is subjected to patterning by which the thin metallic layer 34 is exposed following a profile of the connection pad to be formed, and then electrolytic copper plating is conducted while the thin metallic layer 34 is used as an electric power supplying layer, so that the connection pads 11, 11, . . . and the external connection pads 24, 24, . . . are formed. After that, the residual resist layer is removed as shown in FIG. 2(b).

Figure 2C:
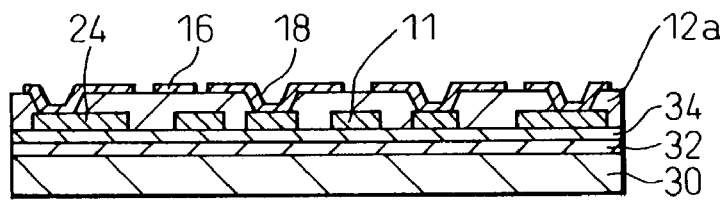

Insulating resin is coated on the thus formed connection pads 11, 11, . . . and external connection pads 24, 24, . . . so that an insulating resin layer is formed. After that, the via holes, from the bottom faces of which the connection pads 11 and external connection pads 24 are exposed, are formed at predetermined positions by laser beams. On the surface of the insulating resin layer including inner wall faces of the via holes, the resin layer 12a is formed which is made in such a manner that the conductor patterns 16 and the vias 18 are formed by the semiadditive method on the thin metallic layer made of copper formed by means of spattering or electroless plating as shown in FIG. 2(c). According to the semiadditive method which forms the conductor patterns 16 and the via holes 18, when the residual resist layer is removed and the thin metallic layer exposed between the conductive patterns 16 is removed by means of etching, the conductive patterns can be insulated from each other.

Figure 2D:
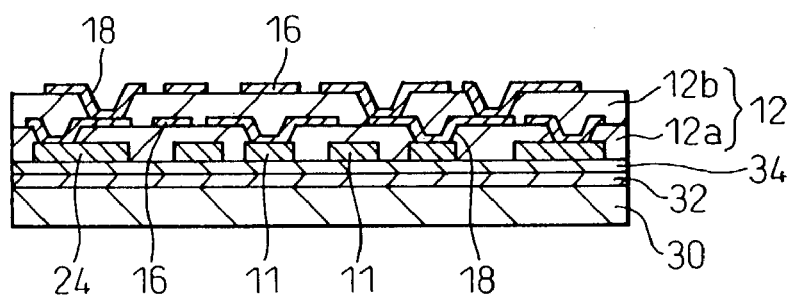
Figure 2E:
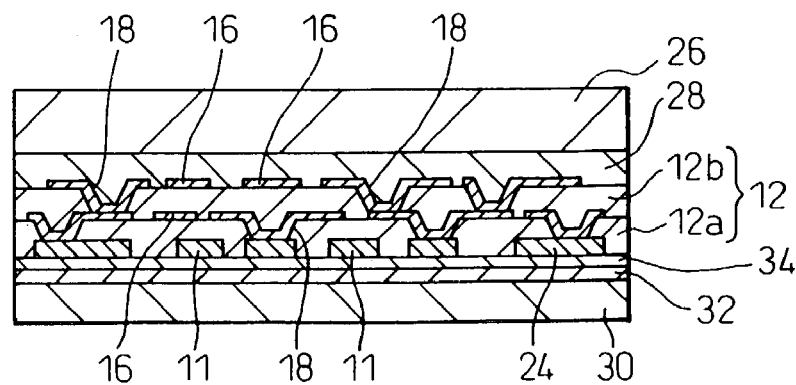

In the same manner, on the resin layer 12a, there is provided a resin layer 12b on which the conductor patterns 16, 16, . . . and the via holes 18, 18, . . . are formed, so that the multilayered circuit substrate 12 is formed as shown in FIG. 2(d). After that, the plate-shaped member 26 composed of a silicon (Si) substrate is joined to the resin layer 12b as shown in FIG. 2(e). In this case, joining is conducted by the elastic resin layer 28 made of insulating resin having rubber elasticity.

Rigidity of the plate-shaped member 26 composed of the thus joined silicon (Si) substrate is higher than the multilayered circuit substrate 12, the primary component of which is resin. Therefore, it is possible to enhance rigidity of the multilayered circuit substrate 12 integrated with the plate-shaped member 26. Accordingly, the multilayered circuit substrate 12 can be easily handled.

Figure 3A:
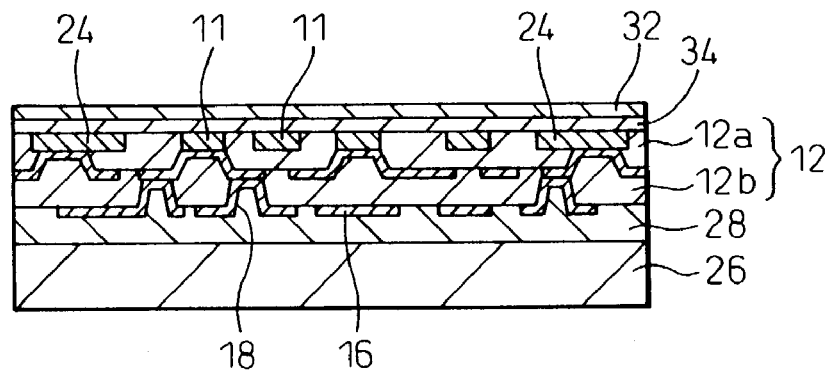

Next, the metallic plate 30 is removed from the other face side, which is exposed, by means of etching as shown in FIG. 3(a). Since the metallic plate 30 shown in FIGS. 2 and 3 is made of copper, an aqueous solution of ferric chloride is used as an etching solution. In this process of etching, the thin resin layer 32 formed on one face of the metallic plate 30 is not etched by the etching solution used for etching the metallic plate 30. Therefore, the connection pads 11 and the external connection pads 24 are prevented from being overetched.

Figure 3B:
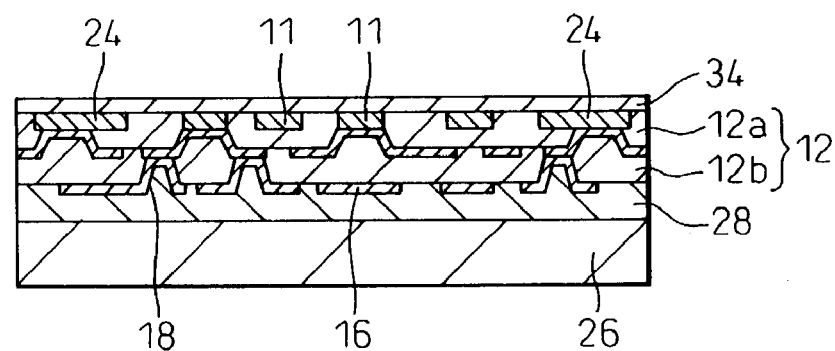
Figure 3C:
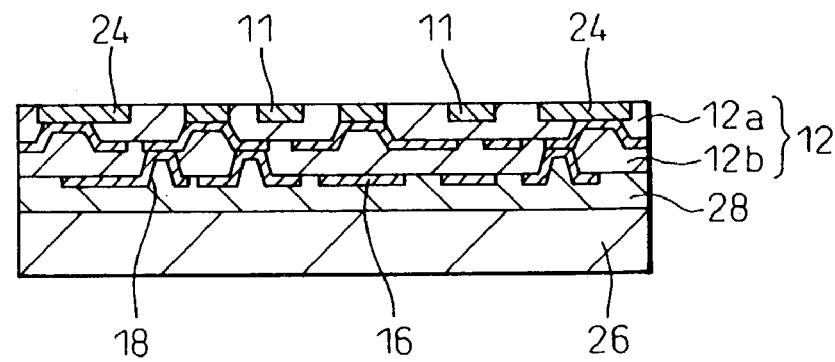

The thin resin layer 32, the surface of which is exposed when the metallic plate 30 is removed, is etched by plasma of $O_2$ so as to be removed, and the surface of the thin metallic layer 34 made of copper is exposed as shown in FIG. 3(b). When this thin metallic layer 34 is removed by etching in which an aqueous solution of ammonium persulfate is used as an etching solution, connection faces of the connection pads 11 formed on the resin layer 12a and the external connection pads 24 can be exposed as shown in FIG. 3(c).

It is preferable that thus exposed connection faces of the connection pads 11 and the external connection pads 24 are subjected to electroless nickel plating and then subjected to electroless gold plating.

The thus obtained multilayered circuit substrate 12 is a multilayered circuit substrate for a semiconductor device on which a semiconductor element mounting face, on which a plurality of semiconductor elements can be mounted in the plane direction, is formed.

The connection pads 11, 11, . . . , the resin layer 12a and the external connection pads 24, 24 . . . , which are formed on the multilayered circuit substrate, are formed first on one face of the metallic plate 30. Therefore, the connection faces of the connection pads 11, 11, . . . and the external connection pads 24, 24 . . . and the surface of the resin layer 12a are formed into a remarkably flat face. Therefore, when the semiconductor elements are mounted on the connection pads 11, 11, . . . formed on the semiconductor element mounting face of the multilayered circuit substrate 12, the electrode terminals of the semiconductor elements are positively contacted with the connection faces of the connection pads 11, 11, . . . . Accordingly, reliability of SIP 10 finally obtained can be enhanced.

In FIG. 3, there is shown a process in which one piece of multilayered circuit substrate 12 is formed. However, it is possible to adopt a process in which after a plurality of multilayered circuit substrates 12 are formed on one piece of plate-shaped member 26, the plate-shaped member 26 is cut off so as to make the individual multilayered circuit substrates 12. Alternatively, after the semiconductor elements 14a, 14b are mounted on the multilayered circuit substrate 12, the plate-shaped member 26 may be cut off.

Alternatively, the following process may be adopted. After a plurality of multilayered circuit substrates 12 are formed on one piece of metallic plate 30, the metallic plate 30 is cut off so as to make the individual multilayered circuit substrates 12, and then the individual multilayered circuit substrates 12 are joined to the plate-shaped member 26. Alternatively, after the metallic plate 30 is joined to the plate-shaped member 26 with respect to each multilayered circuit substrate 12, the metallic plate 30 may be cut off.

In the case of the multilayered circuit substrate 12 shown in FIGS. 1 to 3, the plate-shaped member 26 composed of a silicon (Si) substrate is joined onto the other face of the multilayered circuit substrate 12. However, it is possible to join a circuit substrate, the rigidity of which is higher than that of the multilayered circuit substrate 12, as the plate-shaped member 26. An example is shown in FIG. 4(a).

Figure 4A:
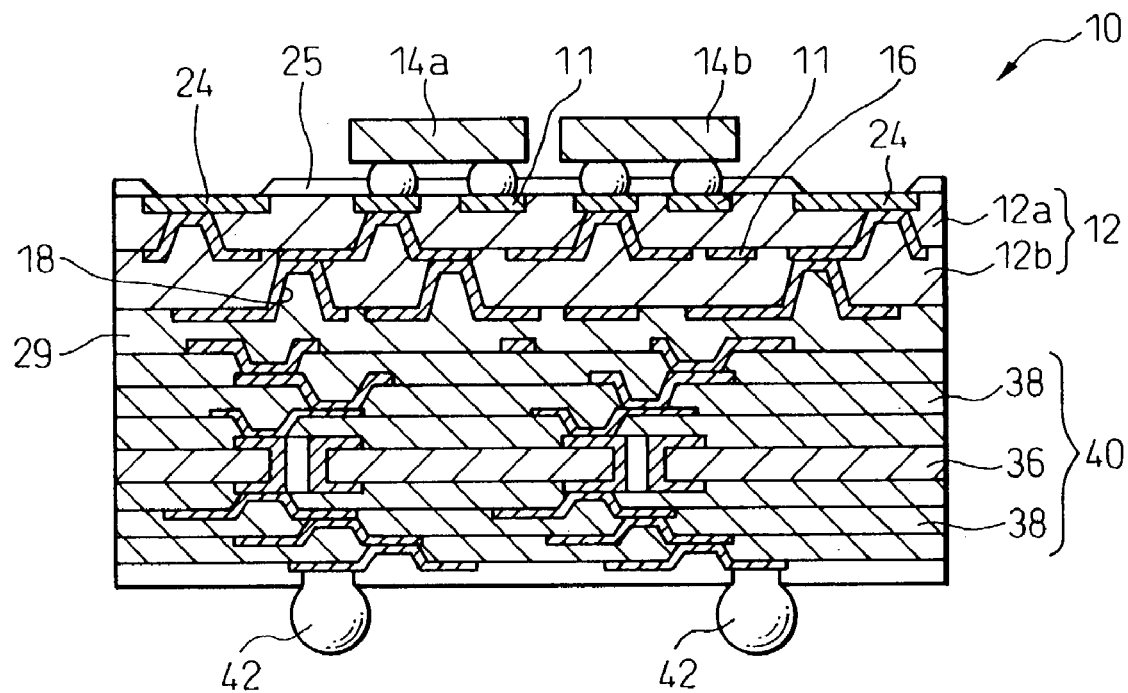
FIG. 4(a) is a sectional view for explaining another example of a semiconductor device of the present invention.

A multilayered circuit substrate shown in FIG. 4(a), the rigidity of which is higher than that of the multilayered circuit substrate 12, is a multilayered circuit substrate 40, the rigidity of which is enhanced by arranging the core substrate 36 made of metal or ceramics at its center. Reference numeral 38 denotes resin layers.

Figure 4B:
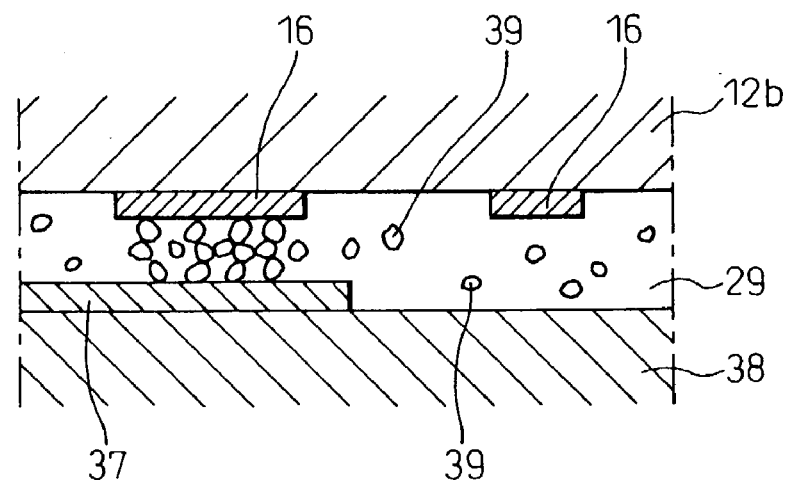
FIG. 4(b) is a partially enlarged view for explaining another example of a semiconductor device of the present invention.

The multilayered circuit substrate 40 and the multilayered circuit substrate 12 are joined to each other by the anisotropic conductive adhesive layer 29 in which conductive particles are blended in elastic resin. As shown in FIG. 4(b), in the anisotropic conductive adhesive agent forming the anisotropic conductive adhesive layer 29, the conductive particles 39, 39, . . . such as silver particles are blended in the elastic resin. Therefore, when pressure is partially given to the anisotropic conductive adhesive agent, the elastic resin flows out from the pressured portion, and the residual conductive particles 39, 39, . . . come into contact with each other, so that an electrically conductive path can be formed. Therefore, as shown in FIG. 4(b), in a portion where the conductive pattern 16 on the multilayered circuit substrate 12 and the conductive pattern 37 on the multilayered circuit substrate 40 are put on each other, when both the substrates are put and pressed to each other via the anisotropic conductive adhesive agent, pressure is partially given to the anisotropic conductive adhesive agent, and elastic resin flows out and the conductive particles 39, 39, . . . remain. The thus remaining conductive particles 39, 39, . . . form an electrically conductive path between the conductive patterns 16, 17.

In the case where a circuit substrate, the rigidity of which is higher than that of the multilayered circuit substrate 12, is joined as the plate member 26 as described above, the solder balls 42, 42 . . . , which are external connection terminals provided on the multilayered circuit substrate 40, can be used for the electrical connection with the mounting substrate as shown in FIG. 4(a).

In the case of SIP 10 shown in FIGS. 4(a) and 4(b), the multilayered circuit substrates 12 and 40 are joined to each other by the anisotropic conductive adhesive layer 29. However, in the case where the multilayered circuit substrates 12 and 40 are joined to each other by the insulating elastic resin layer 31 as shown in FIG. 5, the conductor patterns respectively provided on the multilayered circuit substrates 12 and 40 can be electrically connected with each other by the solder balls 33, 33, . . . .

In the embodiment shown in FIGS. 4(a) and 4(b), a ceramic circuit substrate may be used as the circuit substrate 40. Such a ceramic circuit substrate comprises an insulating layer of ceramic, such as an alumina ceramic, and wiring patterns made of tungsten or molybdenum paste formed thereon.

Figure 5:
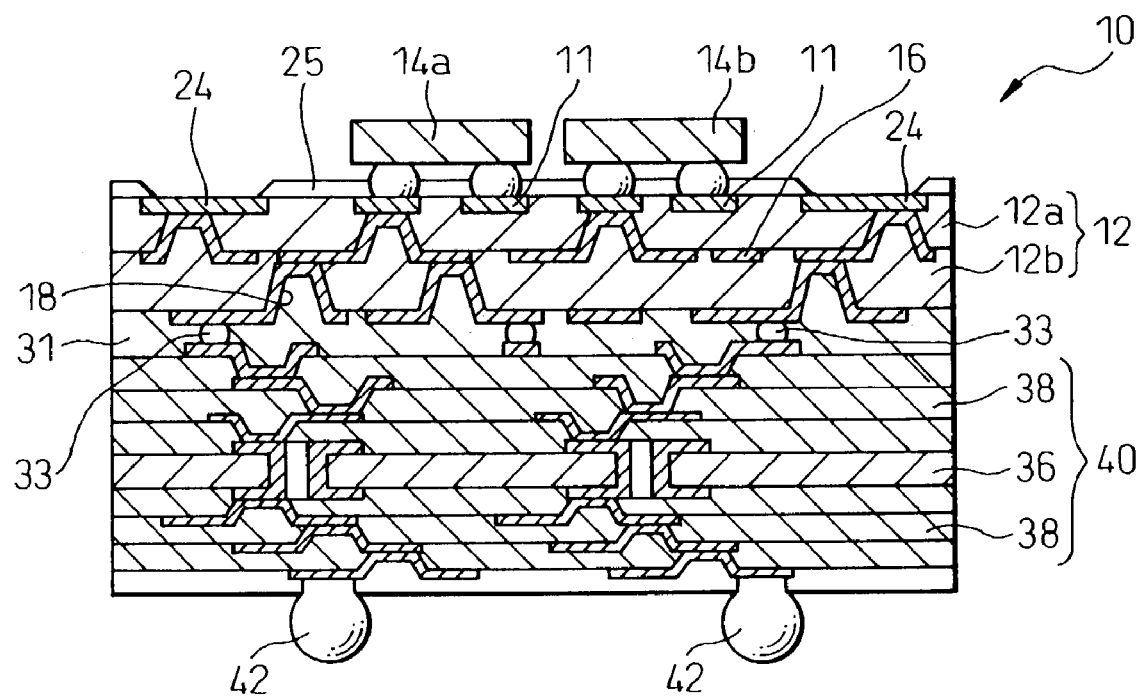
FIG. 5 is a sectional view for explaining another example of the semiconductor device shown in FIG. 4.

SIP 10 shown in FIGS. 4(a), 4(b) and 5 may be provided with both the solder balls 42, 42, . . . , which are external connection terminals of the multilayered circuit substrate 40, and the external connection pads 24 which are electrically connected via the wires 22 with the inner leads 20, 20, . . . of the lead frame connected with the other electronic parts.

Further, in the case of SIP 10 shown in FIGS. 4(a), 4(b) and 5, filling material such as potting resin may be charged between the semiconductor elements 14a, 14b and the multilayered circuit substrate 12.

Figure 6A:
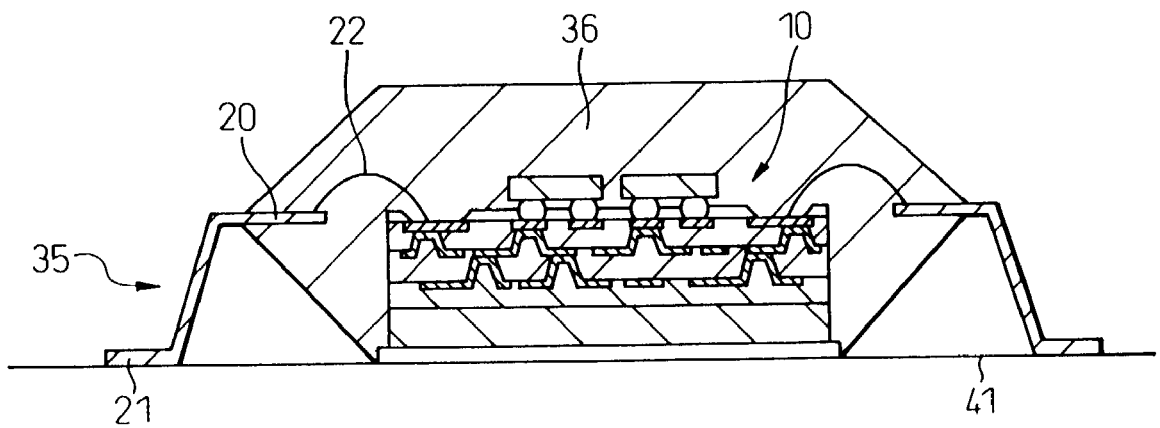
FIGS. 6(a) to 6(c) are sectional views for explaining a state of mounting the semiconductor device shown in FIG. 1 on a mounting substrate.
Figure 6B:
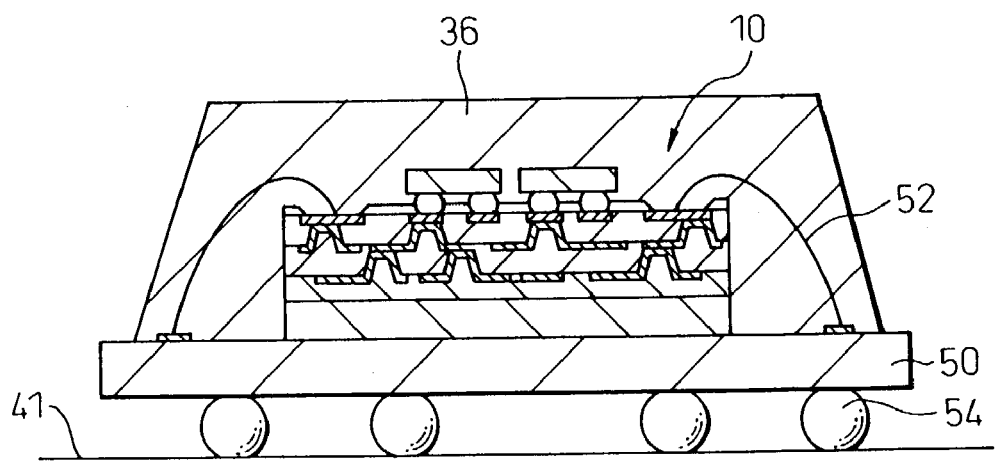
Figure 6C:
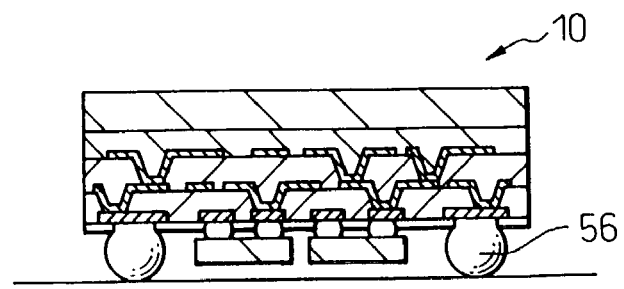
Figure 7A:
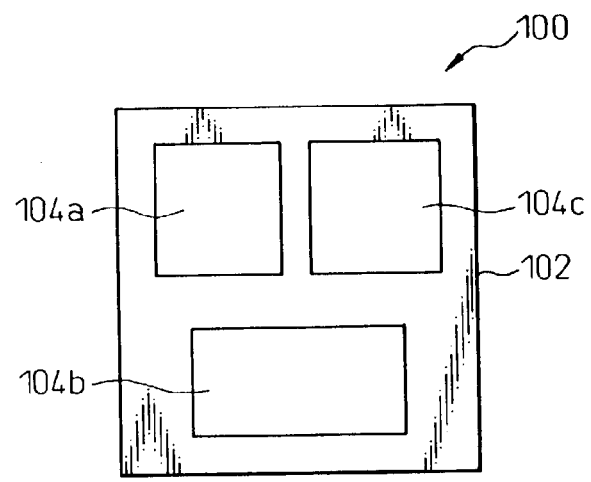
FIG. 7(a) is a plan view for explaining a conventional system-in-package (SIP)
Figure 7B:
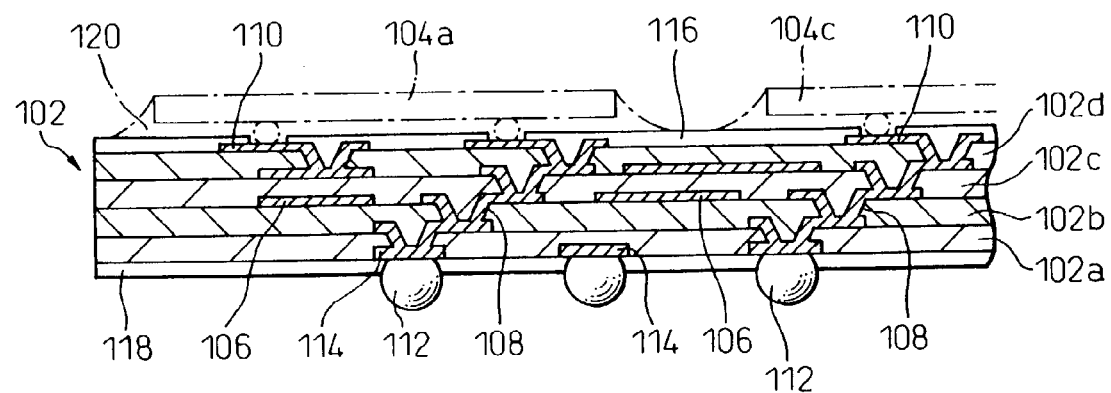
FIG. 7(b) is a partially enlarged sectional view for explaining a conventional system-in-package (SIP)
Figure 8A:
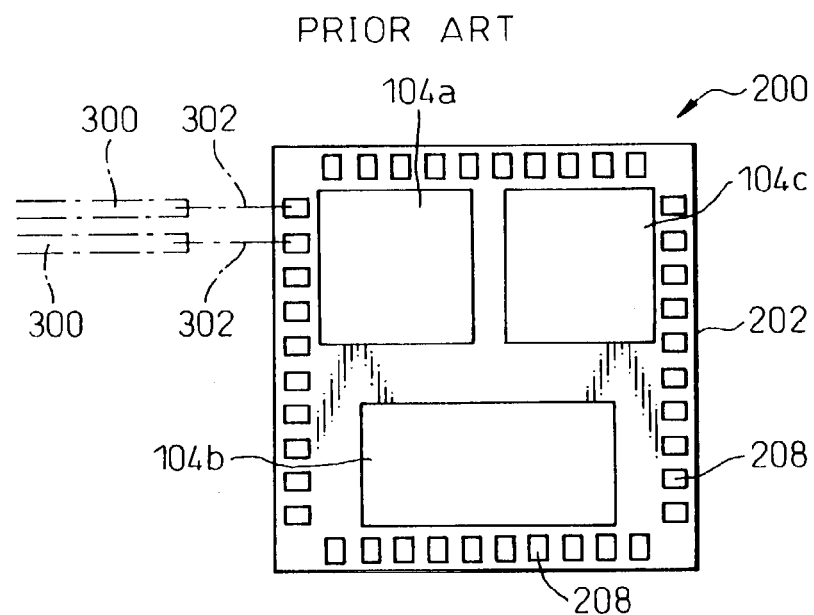
FIG. 8(a) is a plan view for explaining an improved example of a conventional system-in-package (SIP)
Figure 8B:
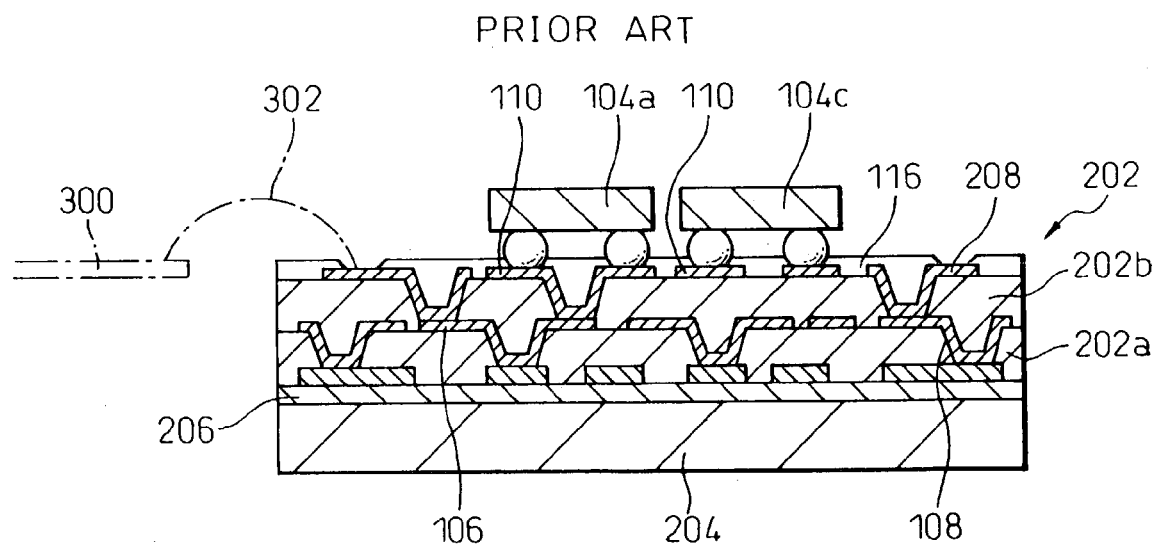
FIG. 8(b) is a sectional view for explaining an improved example of a conventional system-in-package (SIP)
Figure 9:
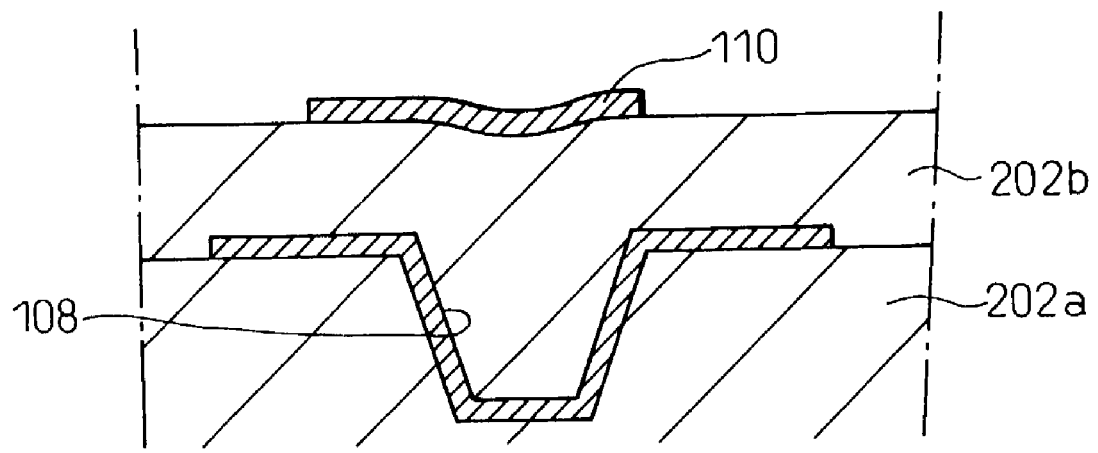
FIG. 9 is a partially enlarged sectional view of the system-in-package (SIP) shown in FIG. 8.

In the case of SIP 10 shown in FIGS. 4(a), 4(b) and 5, the solder balls 42, 42, . . . provided on the multilayered circuit substrate 40 can be used for the electrical connection with the mounting substrate. FIGS. 6(a)–6(c) are views showing a state in which SIP 10 shown in FIG. 1 is mounted on the mounting substrate.

Also, in the embodiment shown in FIGS. 4(a), 4(b) and 5, it should be noted that the external connection pads 24 can be omitted.

Since the size of SIP 10 is appropriate to be handled as a chip, as shown in FIG. 6(a), after the inner leads 20 of the lead frame 35 and the wires 22 are electrically connected with each other, the inner leads 20, SIP 10 and wires 22 are sealed with the sealing resin layer 36 so as to form a sealing body. Next, the sealing body can be mounted on the mounting substrate 41 by the end portions 21 of the outer leads of the lead frame 35 protruding from the sealing resin layer 36.

As shown in FIG. 6(b), SIP 10 joined to the wiring substrate 50 is electrically connected with the wiring substrate 50 by the wires 52, and SIP 10 and the wires 22 are sealed with the sealing resin layer 36, so that a sealing body can be formed. Next, the sealing body is mounted on the mounting substrate 41 by the solder balls 54 which are the external connection terminals provided on the wiring substrate 50.

Further, as shown in FIG. 6(c), the solder balls 56, which are the external connection terminals, may be directly provided in SIP 10 without sealing SIP 10 with sealing resin.

In this connection, the via holes 18, 18, . . . shown in FIGS. 1 to 6 are formed to be concave, however, the via holes may be filled-via-holes in which metal is filled by means of copper plating.

Figure 10:
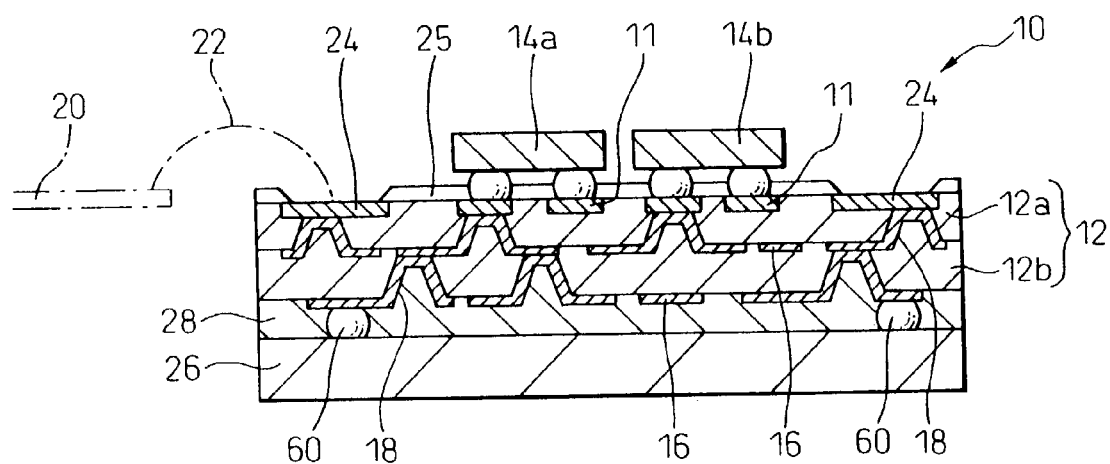
FIG. 10 is a sectional view of a modified embodiment of a semiconductor device shown in FIG. 1.
Figure 11:
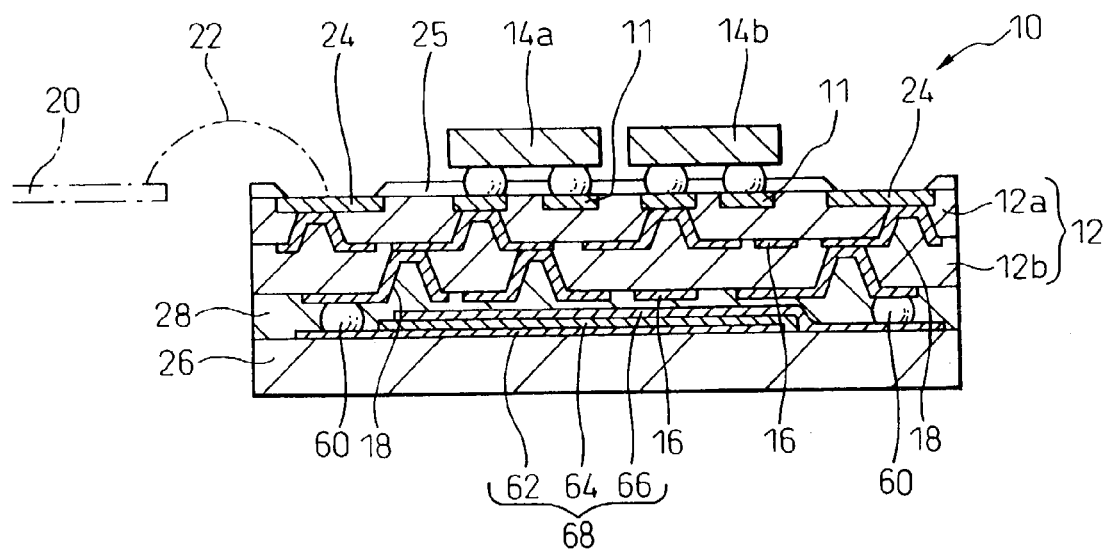
FIG. 11 is a sectional view of a further modified embodiment of a semiconductor device shown in FIG. 1.

Modified embodiments of a semiconductor device according to the present invention are shown in FIGS. 10 and 11. If the plate-shaped member 26 is made of an electrically conductive metal, the plate-shaped member 26 itself can be used as a ground layer or a power supply layer, which can be electrically connected to the conductor patterns 16 via solder bumps 60, as shown in FIG. 10.

On the other hand, if the plate-shaped member 26 is made of an insulating material, such as silicone resin, a metal layer is formed on the plate-shaped member 26 by plating or sputtering. Thus, the metal layer is used as a ground layer or power supply layer, which can be electrically connected to the conductor patterns 16 via solder bumps 60.

Although, in the above-mentioned embodiment as shown in FIG. 10, the solder bumps 60 are used, an anisotropic conductive adhesive layer can be used in place thereof so as to electrically connect the plate-shaped member 26 with the ground layer or power supply layer.

A further modified embodiment of a semiconductor device according to the present invention is shown in FIG. 11. In this embodiment, an electronic element, such as, a capacitor or resistance, can be formed on the plate-shaped member 26. If the plate-shaped member 26 is made of an insulating material, such as silicone resin, a first electrode layer 62 is formed on the plate-shaped member 26 by plating or sputtering, then a ferroelectric layer 64 is formed on the first electrode layer 62, and then a second electrode layer 66 is formed on the ferroelectric layer 64 by plating or sputtering. Thus, a capacitor 68 can be formed.

Also, if the plate-shaped member 26 is made of silicone resin, it is preferable that, before the capacitor 68 is formed, an insulating layer, i.e., a silicone oxide film (not shown) will be formed on the silicone plate-shaped member 26 by thermal-oxidation process.

On the other hand, if the plate-shaped member 26 is made of a metal, the plate-shaped member 26 can be used as one of the electrode layers to form thereon the ferroelectric layer 64 and the other electrode layer to form a capacityor.

In addition, if the plate-shaped member 26 is made of silicone resin, a semiconductor circuit (not shown) similar to a circuit of a semiconductor element can be formed on the plate-shaped member 26.

Also, in this case, an anisotropic conductive adhesive layer can be used, in place the solder bumps, so as to electrically connect the electrode of the plate-shaped member 26 with the conductor patterns.

According to the multilayered circuit substrate for a semiconductor device of the present invention, the connection faces of the connection pads exposed to the semiconductor element mounting face on which a plurality of semiconductor elements are mounted can be formed to be a flat face. Therefore, when the plurality of semiconductor elements are mounted, the electrode terminals of the semiconductor elements can be positively contacted with the connection faces of the connection pads. Accordingly, reliability of the finally obtained semiconductor device, which is called "System-in-package", can be enhanced.

According to the method of manufacturing the multilayered circuit substrate for a semiconductor of the present invention, the connection faces of the connection pads exposed to the semiconductor element mounting face on which a plurality of semiconductor elements are mounted can be formed to be flat without adding a polishing process. Therefore, the manufacturing cost of the finally obtained semiconductor device, which is called "System-in-package", can be reduced.

It should be understood by those skilled in the art that the foregoing description relates to some of the preferred embodiments of the disclosed invention, and that various changes and modifications may be made to the invention without departing the sprit and scope thereof.

What is claimed is:

1. A multi-layered circuit substrate for a semiconductor device, comprising:
    a multi-layered circuit substrate body having first and second surfaces and comprising a plurality of conductive pattern layers integrally laminated, one on another, from said first surface to said second surface, so that a plurality of semiconductor device elements can be arranged on said first surface of the substrate body;
    each of the conductive pattern layers comprising a resin layer and a conductive pattern and having a first side toward the element mounting, first surface of the substrate body and an opposite, second side toward the second surface of the substrate body;
    the conductive patterns of the plurality of conductive pattern layers being electrically interconnected through vias, each via having a closed bottom at the first surface side and an open top at the second surface side; and
    a plate member, a rigidity thereof being higher than that of said substrate body, attached to said second surface of the substrate body.

2. A multi-layered circuit substrate as set forth in claim 1, further comprising:
    an elastic resin layer attaching said plate member is to said second surface of the substrate body.

3. A multi-layered circuit substrate as set forth in claim 2, wherein said elastic resin layer is a silicone resin.

4. A multi-layered circuit substrate as set forth in claim 1, further comprising:
    external connecting pads formed on said first surface of the substrate body.

5. A multi-layered circuit substrate as set forth in claim 1, wherein said plate member is a highly rigid circuit substrate body having a conductive pattern which is electrically connected to said conductive pattern of the multi-layered circuit substrate body.

6. A multi-layered circuit substrate as set forth in claim 5, wherein said conductive pattern of said highly rigid circuit substrate body is electrically connected to said conductive pattern of the multi-layered circuit substrate body by means of solder bonding.

7. A multi-layered circuit substrate as set forth in claim 5, wherein said highly rigid circuit substrate body is attached to said multi-layered circuit substrate body by means of an anisotropic conductive adhesive layer which comprises an elastic resin and conductive particles contained in said elastic resin.

8. A multi-layered circuit substrate as set forth in claim 1, wherein said plate member is a ground layer or a power supply layer.

9. A multi-layered circuit substrate as set forth in claim 1, further comprising a semiconductor circuit, such as a capacitor or resistance, which is formed on said plate member.

10. A semiconductor devices, comprising:
    a multi-layered circuit substrate body having first and second surfaces thereof and comprising a plurality of conductive pattern layers integrally laminated together, from said first surface to said second surface, a semiconductor element mounting surface being defined on said first surface of the substrate body;
    each of the conductive pattern layers comprising a resin layer and a conductive pattern and having a first side toward the element mounting, first surface of the substrate body and an opposite, second side toward the second surface of the substrate body;
    the conductive patterns of the plurality of conductive pattern layers being electrically interconnected through vias, each having a closed bottom at the first surface side and an open top at the second surface side;
    a plate member, a rigidity thereof being higher than that of said substrate body, attached to said second surface of the substrate body; and
    a plurality of semiconductor elements mounted on said semiconductor element mounting surface defined on said first surface of the substrate body.

* * * * *

UNITED STATES PATENT AND TRADEMARK OFFICE
CERTIFICATE OF CORRECTION

| | | |
|---|---|---|
| PATENT NO. | : 7,019,404 B2 | Page 1 of 1 |
| APPLICATION NO. | : 10/347602 | |
| DATED | : March 28, 2006 | |
| INVENTOR(S) | : Akio Rokugawa et al. | |

It is certified that error appears in the above-identified patent and that said Letters Patent is hereby corrected as shown below:

Column 10, line 53, change "capacityor" to -- capacitor --

Column 12, line 27, change "devices" to -- device --

Signed and Sealed this

Thirty-first Day of October, 2006

JON W. DUDAS
*Director of the United States Patent and Trademark Office*